(12) United States Patent
Hayashi et al.

(10) Patent No.: US 6,440,802 B1
(45) Date of Patent: Aug. 27, 2002

(54) PROCESS FOR FABRICATING SEMICONDUCTOR DEVICE AND PHOTOLITHOGRAPHY MASK

(75) Inventors: Keiji Hayashi; Masayuki Nagata, both of Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/940,060

(22) Filed: Aug. 28, 2001

(30) Foreign Application Priority Data

Aug. 28, 2000 (JP) ........................................ 2000-257539

(51) Int. Cl.[7] ................ H01L 21/8238; H01L 21/8249; H01L 21/336
(52) U.S. Cl. ...................... 438/275; 438/199; 438/202; 438/234; 438/279
(58) Field of Search ................................ 438/199, 202, 438/237, 275, 279

(56) References Cited

U.S. PATENT DOCUMENTS

| | | | | |
|---|---|---|---|---|
| 5,523,248 A | * | 6/1996 | Yamazaki | 438/275 |
| 5,950,079 A | * | 9/1999 | Honeycutt et al. | 438/199 |
| 6,001,691 A | * | 12/1999 | Wen | 438/275 |
| 6,096,589 A | * | 8/2000 | Lee et al. | 438/225 |
| 6,143,594 A | * | 11/2000 | Tsao et al. | 438/199 |
| 6,159,795 A | * | 12/2000 | Higashitani et al. | 438/257 |
| 6,165,852 A | * | 12/2000 | Chen et al. | 438/275 |
| 6,228,697 B1 | * | 5/2001 | Furukawa et al. | 438/228 |
| 6,265,254 B1 | * | 7/2001 | Asakura | 438/199 |

FOREIGN PATENT DOCUMENTS

| | | | |
|---|---|---|---|
| JP | 1-157566 A | | 6/1989 |
| JP | 406252165 A | * | 9/1994 |

* cited by examiner

Primary Examiner—Matthew Smith
Assistant Examiner—Chuong A Luu
(74) Attorney, Agent, or Firm—Nixon & Vanderhye, P.C.

(57) ABSTRACT

A process for fabricating a semiconductor device including MOS transistors of low breakdown voltage type and of high breakdown voltage type provided on a semiconductor substrate, the MOS transistor of high breakdown voltage type being operative at a higher voltage than the MOS transistor of low breakdown voltage type and having drift diffusion regions, the process comprises the steps of: forming a LOCOS oxide film on the semiconductor substrate; and performing ion implantation with the use of a single mask having openings respectively defining on the substrate a first region for formation of a first conductivity type MOS transistor of low breakdown voltage type, a second region in which the LOCOS oxide film is formed for isolation of a first conductivity type MOS transistor of high breakdown voltage type, and a third region for formation of a drift diffusion region of a second conductivity type MOS transistor of high breakdown voltage type, so that the first and third regions each have at least two concentration peaks of implanted ions at different depths in the semiconductor substrate, and the second region has a concentration peak of implanted ions in the vicinity of an interface between the LOCOS oxide film and the semiconductor substrate.

5 Claims, 4 Drawing Sheets

Fig. 6 (a) (Prior Art)
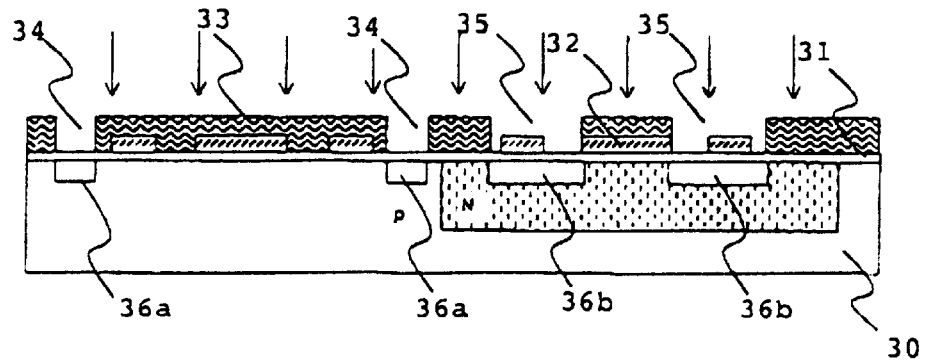
Fig. 6 (b) (Prior Art)
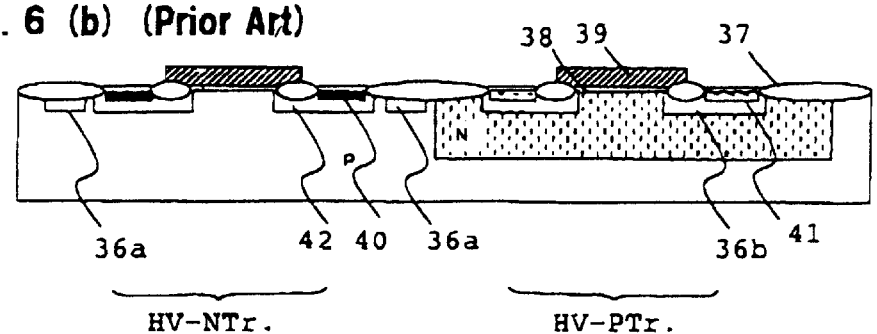
Fig. 7 (Prior Art)
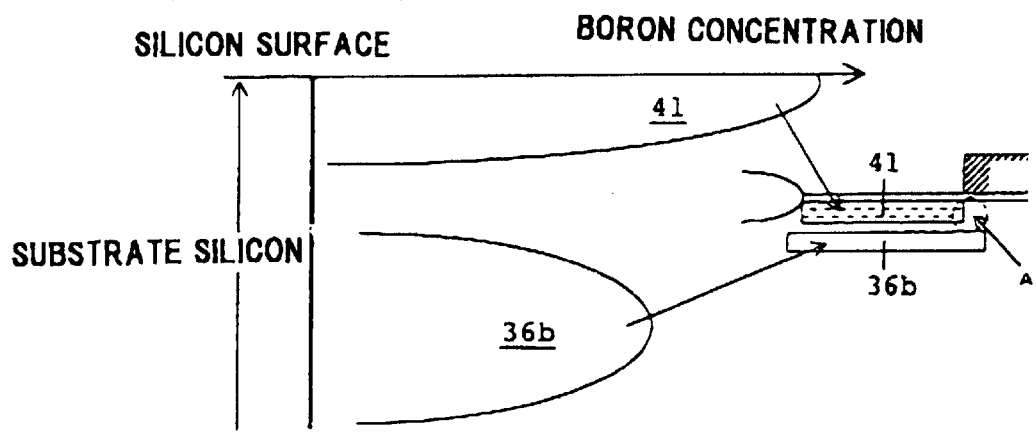

PROCESS FOR FABRICATING SEMICONDUCTOR DEVICE AND PHOTOLITHOGRAPHY MASK

CROSS-REFERENCE TO RELATED APPLICATION

This application is related to Japanese application No. 2000-257539 filed on Aug. 28, 2000, whose priority is claimed under 35 USC § 119, the disclosure of which is incorporated by reference in its entirety.

BACKGROUND OF THE INVENTION

1. Field of the Invention

The present invention relates to a process for fabricating a semiconductor device and, more particularly, to a process for fabricating a semiconductor device which has MOS transistors with and without drift diffusion regions on a single chip.

2. Description of the Related Art

In recent years, liquid crystal panels for use as displays of personal digital assistants such as portable phones have become higher in functionality and lower in costs. There have been correspondingly increasing demands for functionality enhancement and cost reduction of a liquid crystal driving device which is a principal part of such a liquid crystal panel.

The cost reduction of the liquid crystal panel is achieved by reduction in the number of components thereof.

An arrangement hitherto employed for the functionality enhancement is such that circuits for implementing necessary functions, e.g. a signal processing circuit and a memory circuit, are mounted in combination on the liquid crystal driving device.

More specifically, a plurality of multi-function circuits are mounted together on a chip formed with the liquid crystal driving device. Further, a higher level of integration is achieved through the size reduction of the liquid crystal driving device for prevention of the increase in chip size. In general, a chip having a plurality of multi-function circuits mounted thereon in addition to the liquid crystal driving device includes a low breakdown voltage section operative at a low voltage for ordinary signal processing and the like, and a high breakdown voltage section formed with a high breakdown voltage MOS transistor and the like operative at a high voltage for driving the liquid crystal and the like.

In the low breakdown voltage section, the impurity concentration in a well formed with a transistor should be set at a relatively high level for suppression of a short channel effect resulting from the size reduction.

In the high breakdown voltage section, on the other hand, the impurity concentration in a well should be set at a relatively low level to ensure a sufficient breakdown voltage. In particular, the high breakdown voltage MOS transistor typically has drift diffusion regions to alleviate the high voltage application to the transistor for prevention of the breakdown of the transistor itself.

Therefore, the fabrication of the chip having the low breakdown voltage section and the high breakdown voltage section requires the steps of forming masks respectively adapted for doping the low breakdown voltage section with an impurity in a high concentration, for doping the high breakdown voltage section with an impurity in a relatively low concentration, and for doping the drift diffusion regions of the high breakdown voltage MOS transistor with an impurity, and performing ion implantation with the use of the respective masks. In addition to these impurity doping steps, ion implantation is further needed for formation of device isolation regions, requiring an additional masking step. This results in a complicated fabrication process.

For simplification of the fabrication process, a technique has been proposed which employs a single mask for ion implantation for the formation of the drift diffusion regions of the high breakdown voltage MOS transistor and the device isolation regions (for example, Japanese Unexamined Patent Publication No. 1(1989)-157566).

In this method, a silicon oxide film 31 and a silicon nitride film 32 are formed over a P-type silicon substrate 30 preliminarily formed with an N-type well as shown in FIG. 6(a). The silicon nitride film 32 is partly removed in regions where LOCOS oxide films are to be formed. A resist is applied over the resulting silicon substrate 30, and openings are simultaneously formed in regions 34 which later serve as device isolation regions in a high breakdown voltage N-type transistor (HV-NTr) formation region, and in regions 35 which later serve as drift diffusion regions in a high breakdown voltage P-type transistor (HV-PTr) formation region. Thus, a resist pattern 33 is formed.

With the use of the resist pattern 33 thus formed, boron ions are implanted over the resulting substrate for formation of P-type diffusion layers 36a and 36b. In the regions 35 which later serve as the drift diffusion regions in the high breakdown voltage P-type transistor formation region, the boron ions are implanted into the surface of the silicon substrate 30 through the silicon nitride film 32 and the silicon oxide film 31 adapted for the LOCOS oxide film formation.

Thereafter, the LOCOS oxide films 37 are formed as shown in FIG. 6(b). Thus, the P-type diffusion layers 36a of a relatively high boron concentration are located in the vicinity of interfaces between the LOCOS oxide films 37 and the silicon substrate 30 in the device isolation regions in the high breakdown voltage N-type transistor formation region, thereby allowing for device isolation. Further, the drift diffusion regions of the P-type diffusion layers 36b are located in the vicinity of the surface of the high breakdown voltage P-type transistor formation region.

Subsequently, drift diffusion regions 42 for the high breakdown voltage N-type transistor, gate oxide films 38 and gate electrodes 39 are formed on the resulting silicon substrate 30, and then N+ diffusion layers 40 and P+ diffusion layers 41 are formed as source/drain regions in the resulting substrate. Thus, the high breakdown voltage P-type transistor HV-PTr and the high breakdown voltage N-type transistor HV-NTr are completed which each have the drift diffusion regions.

Such a fabrication process can simultaneously form the P-type diffusion layers 36a in the device isolation regions of the high breakdown voltage N-type transistor and the P-type diffusion layers 36b serving as the drift diffusion regions of the high breakdown voltage P-type transistor with the use of the single resist pattern. However, the segregation amount of the implanted impurity ions in the LOCOS oxide films is changed due to LOCOS oxidation variations and the like, because the ion implantation precedes the LOCOS oxidation. This causes variations in breakdown voltage in the device isolation regions, and increases variations in the sheet resistance and effective size of the drift diffusion regions, resulting in variations in the breakdown voltage of the resulting transistors.

To overcome this drawback, one conceivable approach is to implant ions into the silicon substrate under the LOCOS oxide films after the LOCOS oxidation. In this case, however, it is necessary to perform the ion implantation with an acceleration energy such that causes the ions to penetrate through the LOCOS oxide films. Therefore, an ion concentration peak in the drift diffusion region of the P-type diffusion layer 36b in the high breakdown voltage P-type transistor does not overlap an ion concentration peak in the P+ diffusion layer 41 serving as the source/drain region to be formed later, as shown in FIG. 7, so that these regions are separated from each other. As a result, an electric field alleviation effect cannot be provided in an area A adjacent to the drain where the N-type well and the P+diffusion layer 41 contact each other. This leads to reduction in junction breakdown voltage, failing to protect the transistors from breakdown.

The aforesaid fabrication process requires two additional photolithography steps, because the low breakdown voltage section (not shown) should have an increased impurity concentration for suppression of the short channel effect and the high breakdown voltage section should have a relatively great junction depth and a relatively low impurity concentration to ensure a sufficient breakdown voltage.

As described above, it is currently impossible to obviate the photolithography steps for simplification of the fabrication process without deterioration of characteristics of the transistors and the circuitry.

SUMMARY OF THE INVENTION

In view of the foregoing, the present invention is directed to a simplified process for fabricating a semiconductor device which includes a MOS transistor (or a high breakdown voltage MOS transistor) having drift diffusion regions and a MOS transistor (or a low breakdown voltage MOS transistor) having no drift diffusion region on a single chip, without deterioration of characteristics of the transistors and circuitry.

According to the present invention, provided is a process for fabricating a semiconductor device including MOS transistors of low breakdown voltage type and of high breakdown voltage type provided on a semiconductor substrate, the MOS transistor of high breakdown voltage type being operative at a higher voltage than the MOS transistor of low breakdown voltage type and having drift diffusion regions, the process comprising the steps of:

forming a LOCOS oxide film on the semiconductor substrate, and performing ion implantation with the use of a single mask having openings respectively defining on the substrate a first region for formation of a first conductivity type MOS transistor of low breakdown voltage type, a second region in which the LOCOS oxide film is formed for isolation of a first conductivity type MOS transistor of high breakdown voltage type, and a third region for formation of a drift diffusion region of a second conductivity type MOS transistor of high breakdown voltage type, so that the first and third regions each have at least two concentration peaks of implanted ions at different depths in the semiconductor substrate, and the second region has a concentration peak of implanted ions in the vicinity of an interface between the LOCOS oxide film and the semiconductor substrate.

BRIEF DESCRIPTION OF THE DRAWINGS

FIGS. 6(a) and 6(b) are schematic sectional views illustrating steps of a process for fabricating a semiconductor device according to the prior art; and FIG. 7 is a graph illustrating an impurity concentration profile in a drift diffusion region of a high breakdown voltage P-type transistor of FIG. 6 as seen in a depth direction.

DETAILED DESCRIPTION OF THE INVENTION

Figure 1:
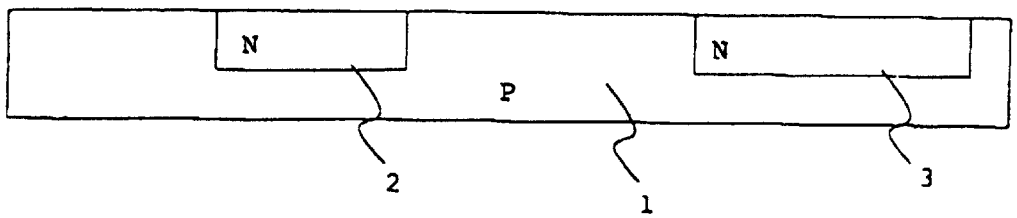
FIGS. 1(a) to 1(d) and 2(e) to 2(h) are schematic sectional views illustrating steps of a process for fabricating a semiconductor device according to one embodiment of the present invention.
Figure 1:
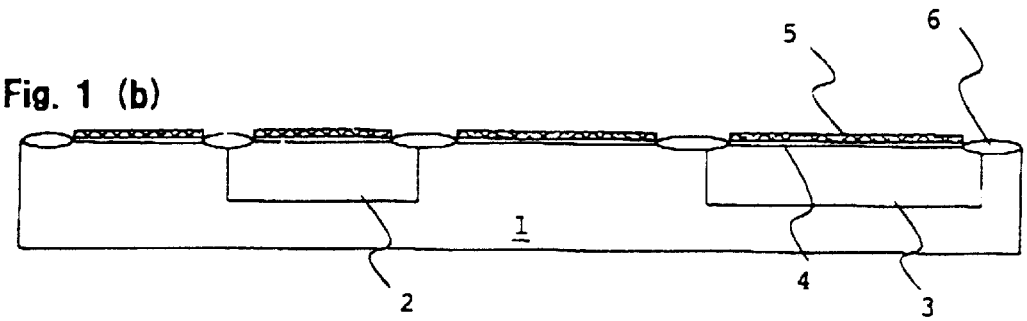
Figure 1:
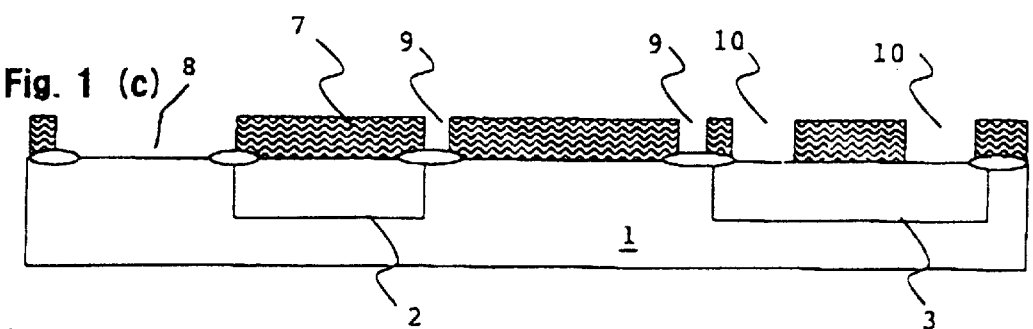
Figure 1:
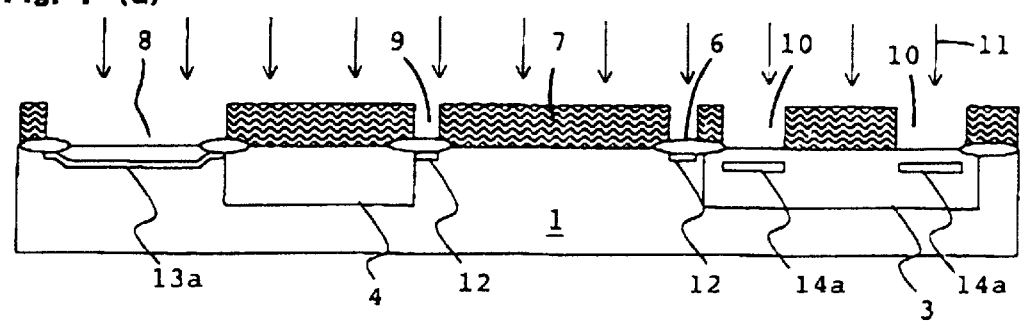

The present invention provides a process for fabricating a semiconductor device which includes MOS transistors of low breakdown voltage type and high breakdown voltage type provided on a semiconductor substrate, the MOS transistor of high breakdown voltage type being operative at a higher voltage than the MOS transistor of low breakdown voltage type and having drift diffusion regions.

In the present invention, the term "MOS transistor of low breakdown voltage type (low breakdown voltage MOS transistor)" means a transistor which constitutes a circuit, such as a signal processing circuit or a memory circuit, operative at a relatively low operating voltage and is therefore capable of withstanding such a level of voltage applied thereto. The term "MOS transistor of high breakdown voltage type (high breakdown voltage MOS transistor" means a transistor which constitutes a circuit operative at a higher operating voltage than the low breakdown voltage MOS transistor and is therefore capable of withstanding such a level of voltage applied thereto.

In the semiconductor device fabrication process, LOCOS oxide films are first formed on a semiconductor substrate. The semiconductor substrate to be herein employed is not particularly limited, but may be any of those typically employed for a semiconductor device. Exemplary materials for the substrate include elemental semiconductors such as silicon and germanium, and compound semiconductors such as GaAs, InGaAs and ZnSe. The substrate may be a bulk semiconductor substrate, or have an SOI or SOS structure. A silicon substrate is particularly preferred among others. The semiconductor substrate is preferably preliminarily doped with a P-type or N-type impurity in a predetermined concentration. Thus, the impurity concentration in the substrate may directly be utilized for a well to be formed with a transistor, depending on the type of the transistor. The impurity concentration is, for example, about $1 \times 10^{16}$ to about $1 \times 10^{17}$ cm$^{-3}$ which is required to ensure the breakdown voltage of a high breakdown voltage N-type transistor. Further, the semiconductor substrate may be formed with one or more wells doped with an N-type or P-type impurity required to ensure the breakdown voltage of a high breakdown voltage P-type transistor or a high breakdown voltage N-type transistor. The impurity concentration in the well may properly be adjusted depending on the type of the transistor to be formed.

An ordinary LOCOS oxidation process may be used for the formation of the LOCOS oxide films on the semiconductor substrate. For example, a silicon oxide film having a thickness of about 10 to about 40 nm and a silicon nitride film having a thickness of about 60 to about 120 nm are first formed on the substrate. The formation of the silicon oxide film may be achieved by a thermal oxidation process, a CVD or the like. The formation of the silicon nitride film may be achieved by a CVD, a plasma CVD or the like. Next, the silicon nitride film is partly removed in regions where the LOCOS oxide films are to be formed. An exemplary method for the removal includes the steps of forming a mask pattern of a predetermined configuration through a photolithography and etching technique, and performing anisotropic etching such as RIE with the use of the mask pattern. In turn, the resulting substrate is subjected to thermal oxidation by using the remaining silicon nitride film as a mask, whereby the LOCOS oxide films are formed as having a thickness of about 200 to about 400 nm. For the thermal oxidation, known conditions may properly be employed. The position, shape and number of the LOCOS oxide films are not particular limited, but it is merely necessary to form the LOCOS oxide films in second regions for isolation of at least a high breakdown voltage MOS transistor of a second conductivity type, which will be described later.

Next, ion implantation is performed with the use of a mask having openings in a first region, second regions and third regions.

The first region termed herein means a region where a low breakdown voltage -MOS transistor of a first conductivity type (P type or N type) is to be formed. The second regions termed therein mean the regions where the LOCOS oxide films are formed in the previous step for isolation of the high breakdown voltage MOS transistor of the first conductivity type. The third regions termed herein mean regions where drift diffusion regions of a high breakdown voltage MOS transistor of the second conductivity type (N type or P type) is to be formed. These regions may each be formed in any shape, size and position on the semiconductor substrate, depending on the functions, characteristics and the like of the semiconductor device to be fabricated.

An exemplary method for the formation of the mask having the openings in the first to third regions may include the steps of applying a resist on the resulting semiconductor substrate, exposing the resist to light or electromagnetic radiation of a desired wavelength with the use of a mask plate (photolithography mask) having an opening formation pattern which defines the first to third regions on the resist, and developing the resist. This method requires only one photolithography step for the formation of the mask. The resist to be herein used may be any of photosensitive resists of a negative type, a positive type and the like typically used in the art. The thickness of the resist is not particularly limited, but may properly be selected depending on the wavelength of the irradiation light and the like. Further, the wavelength of the light or electromagnetic radiation for the exposure of the resist is not particularly limited, but any of various types of radiation such as X-ray, g-line and i-line may be employed.

The resist pattern thus formed on the semiconductor substrate is used as a mask for the ion implantation.

The resulting semiconductor substrate is substantially entirely subjected to the ion implantation with the use of the aforesaid mask so as to allow the first to third regions to thereafter serve predetermined functions. To this end, the ion implantation is performed, for example, so that the first and third regions each have two or more concentration peaks of implanted ions at different depths in the semiconductor substrate and the second regions each have a concentration peak of implanted ions in the vicinity of an interface between the LOCOS oxide film and the semiconductor substrate. In the first region, the low breakdown voltage MOS transistor can thus be formed, and the short channel effect can sufficiently be suppressed. In the second regions, the device isolation can assuredly be achieved, and a sufficient breakdown voltage can be ensured. In the third regions, the drift diffusion regions of the high breakdown voltage MOS transistor can satisfactorily serve their functions.

The ion implantation may be performed only once, but is preferably performed twice or more times. Exemplary methods for performing the ion implantation to form two or more ion concentration peaks at different depths in the substrate include: a method of implanting a plurality of types of ions a plurality of times with a constant acceleration energy; a method of mixedly implanting different types of tons once with a constant acceleration energy; a method of implanting the same type or different types of ions once with a sequentially varying acceleration energy; and a method of implanting the same type or different types of ions a plurality of times with a varying acceleration energy. Among these methods, it is preferable to employ a method of implanting the same type or different types of ions two or three times with a varying acceleration energy. The acceleration energy, the dose and type of the ions and the like for the ion implantation are not particularly limited, but are properly selected so that the first and third regions can serve the aforesaid functions.

More specifically, the ion implantation is preferably performed once with an acceleration energy and an ion type selected so that the second regions each have a concentration peak of implanted ions in the vicinity of the interface between the LOCOS oxide film and the semiconductor substrate, and further at least once with an acceleration energy and an ion type selected so that the first and third regions each have a concentration peak of implanted ions in a shallower position than the concentration peak in the second region. In the second regions, the impurity implanted in the first ion implantation is introduced only into the vicinity of the interfaces between the LOCOS oxide films and the semiconductor substrate whereas the impurity implanted in the second ion implantation remains inside the LOCOS oxide films. In the first region, the well is formed as having an appropriate impurity concentration profile as seen in the depth direction of the substrate. By properly selecting the acceleration energy and the type and dose of the ions, the threshold voltage of the low breakdown voltage MOS transistor and the impurity concentration in the well can each be controlled through at least one ion implantation step. In the third regions, impurity diffusion regions each having a proper impurity concentration can be formed as the drift diffusion regions of the high breakdown voltage MOS transistor at a proper depth.

In the present invention, gate insulating films, gate electrodes, source/drain regions, an interlayer insulating film, contact holes, contact plugs, interconnection layers and the like are formed in a known manner after the steps described above for fabrication of the MOS transistors. A heat treatment, formation of an insulating film, formation of a sidewall spacer, ion implantation and the like may be additionally carried out as required.

A process for fabricating a semiconductor device according to one embodiment of the present invention will hereinafter be described with reference to the attached drawings.

As shown in FIG. 1(a), a P-type silicon substrate 1 is prepared which has a boron concentration ($1\times10^{16}$ to $1\times10^{17}$ $cm^{-3}$) appropriate for formation of a high breakdown voltage N-type transistor. An N-type well 2 having a phosphorus concentration ($1\times10^{17}$ to $2\times10^{17}$ $cm^{-3}$) appropriate for formation of a low breakdown voltage P-type transistor, and an N-type well 3 having a phosphorus concentration ($1\times10^{16}$ to $1\times10^{17}$ $cm^{-3}$) required to ensure the breakdown voltage of a high breakdown voltage P-type transistor are formed in the P-type silicon substrate 1 in a conventional manner.

Then, a silicon oxide film 4 (e.g., 14-nm thick) and an SiN film 5 (e.g., 120-nm thick) for LOCOS oxidation are formed on the substrate, and are partly removed in predetermined regions thereof. Thereafter, the resulting substrate is subjected to LOCOS oxidation for formation of LOCOS oxide films 6 having a thickness of 200 to 400 nm as shown in FIG. 1(b).

In turn, the SiN film 5 remaining in regions not formed with the LOCOS oxide films 6 is removed, and a photoresist 7 is applied over the resulting silicon substrate 1 and then subjected to a photolithography process once, whereby openings are formed in the photoresist 7 in a first region 8 where a low breakdown voltage N-type transistor is to be formed, in second regions 9 for isolation of a high breakdown voltage N-type transistor and in third regions 10 where drift diffusion layers of a high breakdown voltage P-type transistor are to be formed, as shown in FIG. 1(c). Photomask patterns respectively defining the first region 8, the second regions 9 and the third regions 10 are formed in a single photomask.

Subsequently, the resulting substrate is subjected to a first ion implantation process by using the photoresist 7 as a mask for implantation of boron ions 11 as shown in FIG. 1(d). The first ion implantation process is performed under conditions that allows a boron concentration peak to appear in the vicinity of interfaces between the LOCOS oxide films 6 and the silicon substrate 1 in the second regions 9. For example, an acceleration energy of 70 to 150 keV and a dose of $4\times10^{12}$ to $1\times10^{13}$ $cm^{-2}$ are employed for the first ion implantation process. Thus, P-type diffusion layers 12 are formed in the substrate for the isolation of the high breakdown voltage N-type transistor. At the same time, P-type diffusion layers 13a and 14a are formed in the first region 8 and the third regions 10, respectively. In the first and third regions, however, boron concentration peaks are present at a depth of 200 to 400 nm as measured from the surface of the silicon substrate 1 because of the absence of the LOCOS oxide films.

Figure 2:
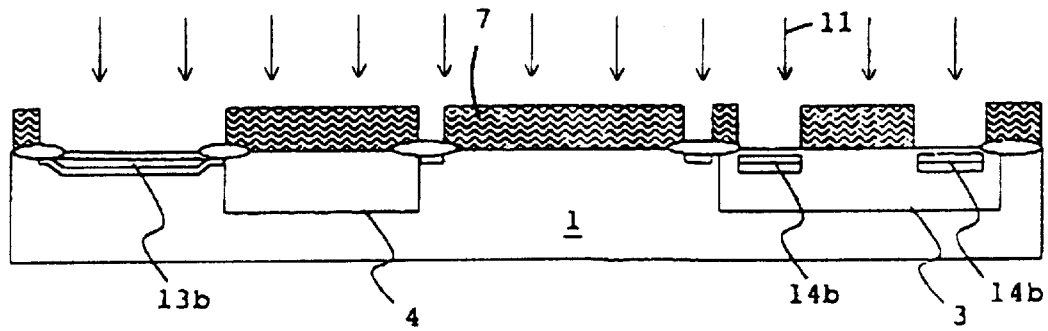
Figure 2:
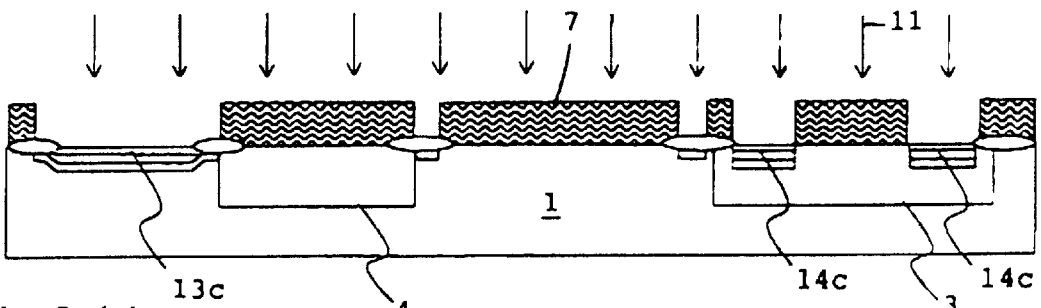
Figure 2:
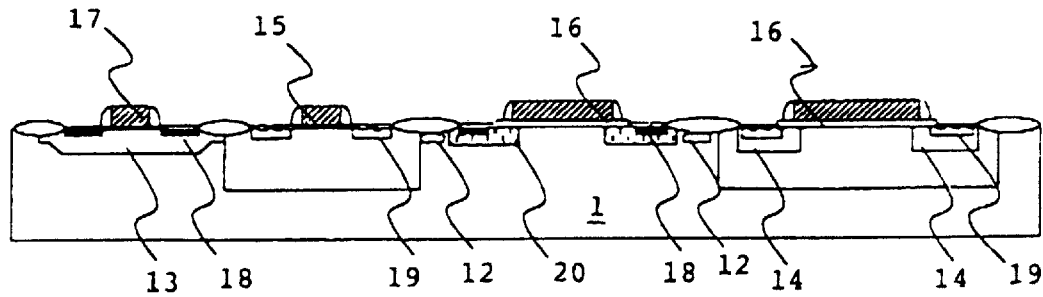
Figure 2:
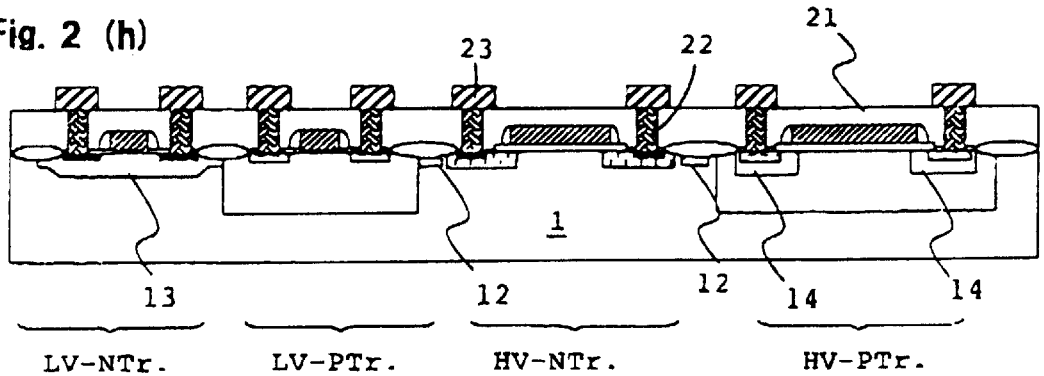

Then, the resulting substrate is subjected to a second ion implantation process by using the same photoresist 7 as a mask for implantation of boron ions 11 as shown in FIG. 2(e). The second ion implantation process is performed under conditions that allows a boron concentration peak to appear in a shallower position in the silicon substrate 1 than the concentration peak of the boron ions implanted in the first ion implantation process. For example, an acceleration energy of 40 to 80 keV and a dose of $2\times10^{12}$ to $8\times10^{12}$ $cm^{-2}$ are employed for the second ion implantation process. Thus, P-type diffusion layers 13b and 14b are formed in the first region 8 and the third regions 10, respectively, at a smaller depth in the silicon substrate 1 than the P-type diffusion layers 13a and 14a.

Further, the resulting substrate is subjected to a third ion implantation process by using the same photoresist 7 as a mask for implantation of boron ions 11 as shown in FIG. 2(f). The third ion implantation process is performed under conditions that allows a boron concentration peak to appear in a shallower position in the silicon substrate 1 than the concentration peak of the boron ions implanted in the second ion implantation process. For example, an acceleration energy of 5 to 30 keV and a dose of $2\times10^{12}$ to $8\times10^{12}$ $cm^{-2}$ are employed for the third ion implantation process. Thus, P-type diffusion layers 13c and 14c are formed in the first region 8 and the third regions 10, respectively, at a smaller depth in the silicon substrate 1 than the P-type diffusion layers 13b and 14b.

Thereafter, the photoresist 7 is removed, and the resulting substrate is subjected to an annealing process in a nitrogen atmosphere at 800 to 900° C. for 10 to 30 minutes for activation of the implanted boron.

Figure 3:
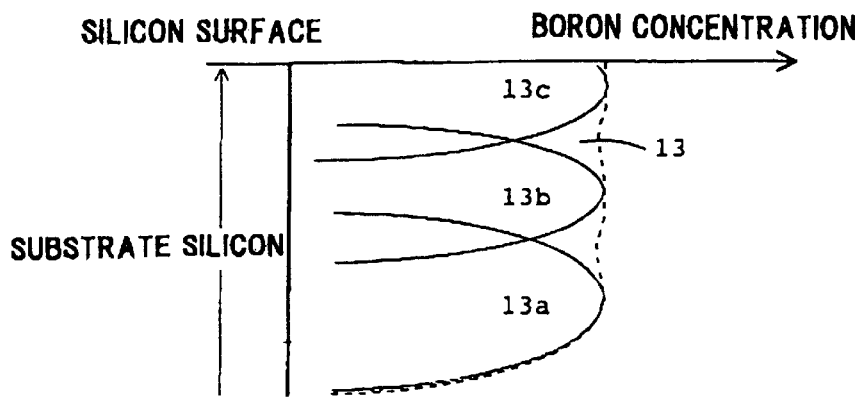
FIG. 3 is a graph illustrating an impurity concentration profile in a first region as seen in a depth direction.

In the first region 8, the boron ions are implanted in a relatively high concentration by the first, second and third ion implantation processes with the ion concentration peaks present at different depths in the silicon substrate 1 as shown in FIG. 3. In other words, the impurity concentration in the low breakdown voltage P-type substrate can be controlled by the first and second ion implantation processes, while the threshold voltage of the low breakdown voltage-N-type MOS transistor can be controlled by the. third ion implantation process. Therefore, the boron ions originally implanted in the silicon substrate 1 and the boron ions in the P-type diffusion layers 13a, 13b and 13c are finally present together in a generally uniform concentration on the order of $1\times10^{17}$ to $2\times10^{17}$ $cm^{-3}$ in the first region of the substrate as indicated by a broken line in FIG. 3, whereby a P-type well 13 is formed which has an impurity concentration appropriate for suppression of the short channel effect required for the low breakdown voltage transistor.

Figure 4:
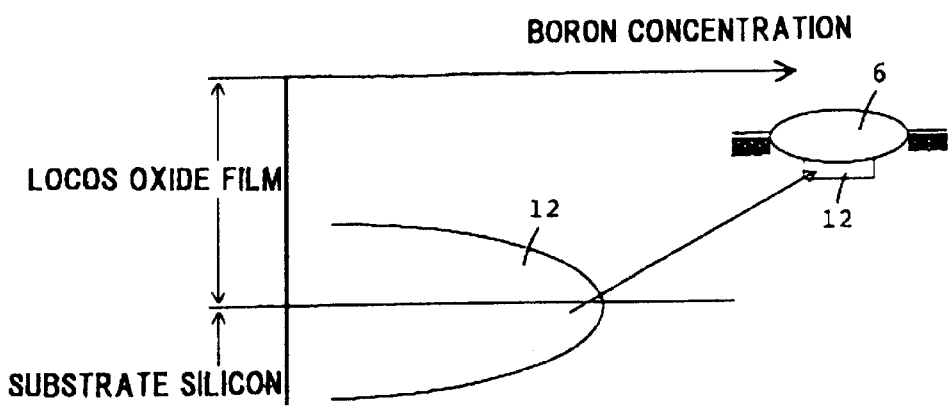
FIG. 4 is a graph illustrating an impurity concentration profile in a second region as seen in a depth direction.

In the second regions 9, the P-type diffusion layers 12 are formed which each have the boron concentration peak in the vicinity of the interface of the LOCOS oxide film 6 and the silicon substrate 1 as shown in FIG. 4. This provides a desired breakdown voltage sufficient for isolation of the N-type transistor. Since the ion implantation is performed after the LOCOS oxidation, variations in the segregation amount of the implanted impurity in the LOCOS oxide films can be eliminated which may otherwise occur due to LOCOS oxide film variations and the like. Therefore, there are no variations in breakdown voltage.

Figure 5:
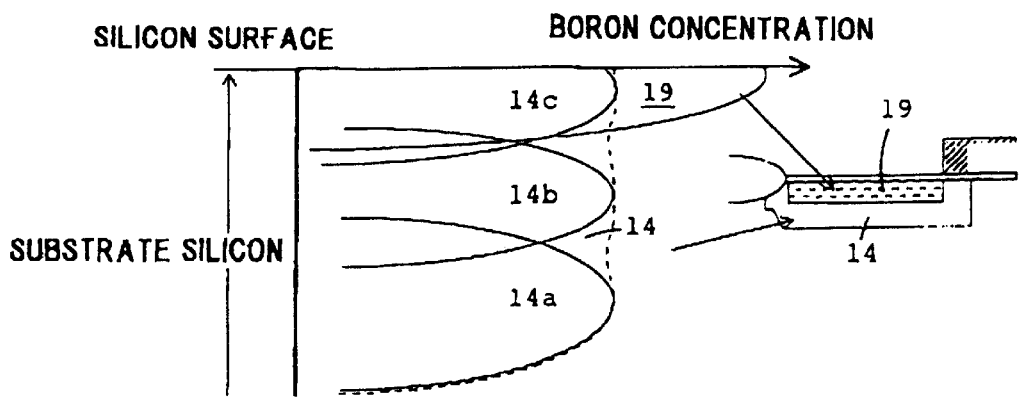
FIG. 5 is a graph illustrating an impurity concentration profile in a third region as seen in a depth direction.

In the third regions 10, the boron ions are implanted in a relatively high concentration by the first, second and third ion implantation processes with the ion concentration peaks present at different depths in the silicon substrate 1 as shown in FIG. 5. Finally, drift diffusion regions 14 are respectively formed in the third regions 10 as completely surrounding $P^+$ diffusion layers 19 serving as source/drain regions, thereby providing a desired breakdown voltage.

Thereafter, another photoresist (not shown) is formed on the resulting substrate, and ion implantation is performed three times in substantially the same manner as described above for formation of drift diffusion regions 20 for the high breakdown voltage N-type transistor.

Next, gate oxide films 15 for low breakdown voltage, gate oxide films 16 for high breakdown voltage, gate electrodes 17, $N^+$ diffusion layers 18 serving as source/drain regions, and the $P^+$ diffusion layers 19 are formed as shown in FIG. 2(g). At this time, the $P^+$ diffusion layers 19 in the third regions 10 are adapted to be completely surrounded by the drift diffusion region 14. This allows the drift diffusion regions to provide a breakdown voltage of 10 to 30 V in the vicinity of the drain of the high breakdown voltage P-type transistor.

Subsequently, an interlayer insulating film 21 is formed on the resulting substrate by a CVD, followed by formation of contract holes, contacts 22 and metal interconnect lines 23 as shown in FIG. 2(h), whereby the low breakdown voltage N-type transistor LV-NTr, the low breakdown voltage P-type transistor LV-PTR, the high breakdown voltage N-type transistor HV-NTr and the high breakdown voltage P-type transistor HV-PTr are provided.

In accordance with the present invention, the LOCOS oxide films are first formed, and then ion implantation is performed with the use of the mask having the openings in the first region for the formation of the low breakdown voltage MOS transistor, in the second regions for the device isolation, and in the third regions for the formation of the drift diffusion regions of the high breakdown voltage MOS transistor. This requires only one photolithographic mask-forming step to simplify the fabrication process, thereby reducing the fabrication costs.

Where ions are implanted into the substrate so that the first and third regions each have concentration peaks at least in the vicinity of the interface between the LOCOS oxide film and the semiconductor substrate and in a shallower position than the vicinity of the interface, the ion implantation is performed once with an acceleration energy that allows the second regions to each have an ion concentration peak in the vicinity of the interface between the LOCOS oxide film and the semiconductor substrate, and the ion implantation is performed at least once with an acceleration energy lower than the acceleration energy employed in the previous ion implantation. Thus, unwanted impurity introduction can be prevented by the LOCOS oxide films in the second regions, while the impurity concentration in the first region can properly be controlled so as to control the threshold voltage of the low breakdown voltage transistor and to provide the short channel effect required for the low breakdown voltage transistor. In the third regions, the drift diffusion regions of the high breakdown voltage MOS transistor provide a sufficient electric field alleviating effect, and ensure a high breakdown voltage.

Where the ion implantation is performed two or more times with different acceleration energies, the threshold voltage of the low breakdown voltage MOS transistor in the first region is controlled by performing the ion implantation at least once, and the impurity concentration in the semiconductor substrate is controlled by performing the ion implantation at least once. Thus, a desired impurity concentration profile can conveniently and easily be formed in the substrate, allowing for simplification of the fabrication process and reduction of the fabrication costs.

What is claimed is:

1. A process for fabricating a semiconductor device including MOS transistors of low breakdown voltage type and of high breakdown voltage type provided on a semiconductor substrate, the MOS transistor of high breakdown voltage type being operative at a higher voltage than the MOS transistor of low breakdown voltage type and having drift diffusion regions, the process comprising the steps of:
   forming a LOCOS oxide film on the semiconductor substrate; and
   performing ion implantation with the use of a single mask having openings respectively defining on the substrate a first region for formation of a first conductivity type MOS transistor of low breakdown voltage type, a second region in which the LOCOS oxide film is formed for isolation of a first conductivity type MOS transistor of high breakdown voltage type, and a third region for formation of a drift diffusion region of a second conductivity type MOS transistor of high breakdown voltage type, so that the first and third regions each have at least two concentration peaks of implanted ions at different depths in the semiconductor substrate, and the second region has a concentration peak of implanted ions in the vicinity of an interface between the LOCOS oxide film and the semiconductor substrate.

2. A process as set forth in claim 1, wherein the ion implantation is performed so that the concentration peaks in the first and third regions are present at almost the same depth as the depth of the interface between the LOCOS oxide film and the semiconductor substrate and at a depth shallower than the depth of the interface.

3. A process as set forth in claim 1, wherein the ion implantation is performed at least twice with different acceleration energies.

4. A process as set forth in claim 1, wherein the ion implantation is performed once with an acceleration energy that allows the second region to have the concentration peak of the implanted ions in the vicinity of the interface between the LOCOS oxide film and the semiconductor substrate, and then at least once with an acceleration energy lower than the acceleration energy employed in the previous ion implantation.

5. A process as set forth in claim 1, wherein the ion implantation is performed at least once to control a threshold voltage of the low breakdown voltage MOS transistor in the first region, and then at least once to control the impurity concentration in the semiconductor substrate.

* * * * *